(12) United States Patent
Shen et al.

(10) Patent No.: US 8,241,963 B2
(45) Date of Patent: Aug. 14, 2012

(54) RECESSED PILLAR STRUCTURE

(75) Inventors: Wen-Wei Shen, Xinzhuang (TW);
Yao-Chun Chuang, Taipei (TW);
Chen-Shien Chen, Zhubei (TW);
Ming-Fa Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/835,189

(22) Filed: Jul. 13, 2010

(65) Prior Publication Data

US 2012/0012997 A1    Jan. 19, 2012

(51) Int. Cl.
*H01L 21/00* (2006.01)

(52) U.S. Cl. ........ 438/121; 438/106; 438/107; 257/737; 257/E21.507; 257/E23.079

(58) Field of Classification Search .................. 257/737, 257/E21.507, E23.079; 438/106, 107, 121
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,466,635 A | 11/1995 | Lynch et al. | |
| 5,481,133 A | 1/1996 | Hsu | |
| 5,736,456 A | 4/1998 | Akram | |
| 5,759,910 A | 6/1998 | Mangold et al. | |
| 6,002,177 A | 12/1999 | Gaynes et al. | |
| 6,107,164 A | 8/2000 | Ohuchi | |
| 6,107,180 A | 8/2000 | Munroe et al. | |
| 6,175,161 B1 | 1/2001 | Goetz et al. | |
| 6,187,678 B1 | 2/2001 | Gaynes et al. | |
| 6,229,216 B1 | 5/2001 | Ma et al. | |
| 6,229,220 B1 | 5/2001 | Saitoh et al. | |
| 6,232,243 B1 | 5/2001 | Farnworth et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,323,546 B2 | 11/2001 | Hsuan et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,454,159 B1 | 9/2002 | Takushima | |
| 6,461,895 B1 | 10/2002 | Liang et al. | |
| 6,562,653 B1 | 5/2003 | Ma et al. | |

(Continued)

FOREIGN PATENT DOCUMENTS

CN    1375869 A    10/2002

(Continued)

*Primary Examiner* — Zandra Smith
*Assistant Examiner* — Marvin Payen
(74) *Attorney, Agent, or Firm* — Slater & Matsil, L.L.P.

(57) ABSTRACT

A bump structure that may be used to interconnect one substrate to another substrate is provided. A recessed conductive pillar is formed on a first substrate such that the recessed conductive pillar has a recess formed therein. The recess may be filled with a solder material. A conductive pillar on a second substrate may be formed having a contact surface with a width less than or equal to a width of the recess. The first substrate may be attached to the second substrate such that the conductive pillar on the second substrate is positioned over or in the recess of the first substrate. The substrates may each be an integrated circuit die, an interposer, a printed circuit board, a high-density interconnect, or the like.

20 Claims, 4 Drawing Sheets

U.S. PATENT DOCUMENTS

| | | |
|---|---|---|
| 6,562,665 B1 * | 5/2003 | Yu .................................. 438/149 |
| 6,570,248 B1 | 5/2003 | Ahn et al. |
| 6,600,222 B1 | 7/2003 | Levardo |
| 6,600,234 B2 | 7/2003 | Kuwabara et al. |
| 6,607,938 B2 | 8/2003 | Kwon et al. |
| 6,661,085 B2 | 12/2003 | Kellar et al. |
| 6,717,245 B1 | 4/2004 | Kinsman et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,906,418 B2 | 6/2005 | Hiatt et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,960,829 B2 | 11/2005 | Hogerl |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,129,575 B1 | 10/2006 | Lin et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,271,084 B2 | 9/2007 | Jeong et al. |
| 7,276,799 B2 | 10/2007 | Lee et al. |
| 7,279,795 B2 | 10/2007 | Periaman et al. |
| 7,285,867 B2 | 10/2007 | Matsuzaki et al. |
| 7,307,005 B2 | 12/2007 | Kobrinsky et al. |
| 7,317,256 B2 | 1/2008 | William et al. |
| 7,320,928 B2 | 1/2008 | Kloster et al. |
| 7,327,040 B2 | 2/2008 | Aoki et al. |
| 7,345,350 B2 | 3/2008 | Sinha |
| 7,382,049 B2 | 6/2008 | Ho et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2002/0132461 A1 | 9/2002 | Kizaki |
| 2003/0107137 A1 | 6/2003 | Stierman et al. |
| 2005/0026416 A1 | 2/2005 | Cheng et al. |
| 2005/0084989 A1 | 4/2005 | Wakabayashi et al. |
| 2006/0055032 A1 | 3/2006 | Chang et al. |
| 2006/0108685 A1 * | 5/2006 | Tsou et al. .................. 257/737 |
| 2006/0180887 A1 | 8/2006 | Ono |
| 2006/0207088 A1 | 9/2006 | Yamano |
| 2006/0211233 A1 | 9/2006 | Gan et al. |
| 2007/0029654 A1 | 2/2007 | Sunohara et al. |
| 2007/0145101 A1 * | 6/2007 | Kataoka et al. ............... 228/101 |
| 2008/0296764 A1 | 12/2008 | Chang et al. |
| 2009/0096092 A1 | 4/2009 | Patel |
| 2009/0108453 A1 * | 4/2009 | Lin et al. ..................... 257/758 |
| 2009/0130840 A1 | 5/2009 | Wang et al. |
| 2011/0186986 A1 | 8/2011 | Chuang et al. |
| 2011/0193220 A1 | 8/2011 | Kuo et al. |
| 2012/0012997 A1 | 1/2012 | Shen et al. |

FOREIGN PATENT DOCUMENTS

| | | |
|---|---|---|
| CN | 1750257 A | 3/2006 |
| JP | 2006-287048 | 10/2006 |

* cited by examiner

RECESSED PILLAR STRUCTURE

TECHNICAL FIELD

This disclosure relates generally to integrated circuits and, more particularly, to pillar structures for use with semiconductor dies.

BACKGROUND

Since the disclosure of the integrated circuit, the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit (IC) formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on flip-chip interconnections and the use of conductive balls/bumps to form a connection between the die and the underlying substrate, thereby allowing high-wiring density in a relatively small package. In this situation, a conductive bump is formed on one surface and direct contact is made with a post or pad on the other surface. Misalignment, however, often occurs between the contacts on the opposing surfaces. The misalignment may result in shorts between contacts and/or damage to the devices.

Furthermore, the difference in materials and the respective coefficient of thermal expansion (CTE) values creates stress in the joint region. The stress may cause the joint to crack and/or cause other problems, such as delamination issues of the dielectric layers.

SUMMARY

In accordance with an embodiment, a device having a first substrate and a contact pad formed thereon is provided. A conductive pillar is formed over the contact pad such that the conductive pillar has a recess formed therein. The recess may be filled with a conductive material such as solder material. A conductive pillar of a second substrate may be positioned such that the conductive pillar of the second substrate is position above or within the recess of the first substrate. The first and second substrates may each be an integrated circuit die, an interposer, a printed circuit board, a high-density interconnect, or the like.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of embodiments are discussed in detail below. It should be appreciated, however, that this disclosure provides many applicable inventive concepts that can be embodied in a wide variety of specific contexts. The specific embodiments discussed herein are merely illustrative of specific ways to make and use the embodiments, and do not limit the scope of the disclosure.

Embodiments of the present disclosure relate to the use of bumps or balls (collectively referred to herein as bumps) for use with interconnecting one substrate with another substrate, wherein each substrate may be an integrated circuit die, an interposer, packaging substrate, printed circuit board, high-density interconnect, and/or the like. As will be discussed below, embodiments are disclosed that utilize a pillar having a recess. It has been found that embodiments such as those discussed herein may reduce misalignment, thereby increasing throughput and reliability. The intermediate stages of a method for forming a pillar are disclosed herein. Embodiments such as these may be suitable for use in a three-dimensional (3D) integrated circuit (IC) or stacked die configuration. Throughout the various views and illustrative embodiments of the present disclosure, like reference numbers are used to designate like elements.

Figure 1:
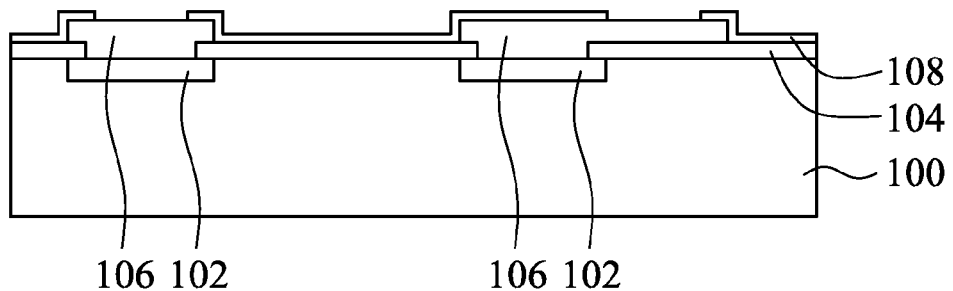
FIGS. 1-5 illustrate intermediate stages in forming a semiconductor device having a bump structure in accordance with an embodiment.

FIGS. 1-5 illustrate various intermediate stages of a method of forming a semiconductor device having a pillar with a recess formed therein in accordance with an embodiment. Referring first to FIG. 1, a portion of a substrate 100 is shown in accordance with an embodiment. The substrate 100 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as multi-layered or gradient substrates may also be used. In another embodiment, the substrate 100 may comprise a substrate to which an integrated circuit die may be attached. For example, the substrate 100 may include an interposer, a packaging substrate, a high-density interconnect, a printed circuit board, another integrated circuit die, or the like.

It should be noted that in some embodiments, particularly in embodiments in which the substrate 100 comprises an integrated circuit die, the substrate 100 may include electrical circuitry (not shown). In an embodiment, the electrical circuitry includes electrical devices formed on the substrate 100 with one or more dielectric layers overlying the electrical devices. Metal layers may be formed between dielectric layers to route electrical signals between the electrical devices. Electrical devices may also be formed in one or more dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application. In the case the substrate 100 is an interposer, the interposer may include passive elements, active element, both active elements and passive elements, or neither.

Conductive pads 102 are provided in an upper surface of the substrate 100 to provide external electrical connections. It should be noted that the conductive pads 102 may represent an electrical connection to electrical circuitry formed on the substrate 100, an electrical connection to a through-substrate via, a redistribution line, and/or the like. The conductive pads 102 may comprise a conductive material such as copper, although other conductive materials, such as tungsten, aluminum, or a copper alloy may alternatively be used. The conductive pads 102 may be formed using a damascene or dual damascene process which may include a copper overfill into an opening followed by the removal of the excess copper through a process such as chemical mechanical polishing (CMP). However, any suitable material (such as, e.g., aluminum) and any suitable process (such as deposition and etching) may alternatively be used to form the conductive pads 102.

A first passivation layer 104 may be formed of a dielectric material, such as polyimide, polymer, an oxide, a nitride, or the like, and patterned over the surface of the substrate 100 to provide an opening over the conductive pads 102 and to protect the underlying layers from various environmental contaminants. In an embodiment, the first passivation layer 104 comprises a composite layer of a layer of silicon nitride and an oxide layer. The silicon nitride layer may be formed using chemical vapor deposition (CVD) techniques using silane and ammonia as precursor gases to a thickness of about 2000 Å. The oxide layer may be formed by any oxidation process, such as wet or dry thermal oxidation in an ambient comprising an oxide, $H_2O$, NO, or a combination thereof, or by CVD techniques using is tetra-ethyl-ortho-silicate (TEOS) and oxygen as a precursor. In an embodiment, the oxide layer has a thickness about 10,000 Å.

In an embodiment in which the first passivation layer 104 comprises a silicon nitride layer and an oxide layer, an opening may be formed exposing the conductive pads 102 using a wet etch process in dilute hydrofluoric acid to etch the silicon dioxide and a wet etch process using phosphoric acid to etch the silicon nitride layer.

Thereafter, bond pads 106 are formed and patterned over the first passivation layer 104. The bond pads 106 provide an electrical connection upon which a UBM structure may be formed for external connections in subsequent processing steps. The bond pads 106 may be formed of any suitable conductive material, such as copper, titanium, tungsten, aluminum, silver, combinations thereof, or the like.

In an embodiment, a titanium barrier layer is deposited using physical vapor deposition (PVD) techniques to a thickness of about 500 Å and a copper seed layer is deposited using PVD techniques to a thickness of about 3,000 Å. Thereafter, a copper layer may be deposited using electroplating (ECP) techniques to a thickness of about 3 μm. Generally, in an ECP process, the wafer is submerged or immersed in the electroplating solution. The wafer surface is electrically connected to the negative side of an external DC power supply such that the wafer functions as the cathode in the electroplating process. A solid conductive anode, such as a copper anode, is also immersed in the solution and is attached to the positive side of the power supply. The atoms from the anode are dissolved into the solution, from which the cathode, e.g., the wafer, acquires, thereby plating the exposed conductive areas of the wafer, e.g., the surfaces of the seed layer. The excess materials may be removed a wet dip in a chemical solution of phosphoric acid ($H_3PO_4$) and hydrogen peroxide ($H_2O_2$), referred to as DPP, with 2% hydrofluoric (HF) acid, or another cleaning process, may be used.

One or more second passivation layers, such as a second passivation layer 108, are formed and patterned over the bond pads 106 as illustrated in FIG. 1. The second passivation layer 108 may be formed of a dielectric material, such as polymer, a nitride, an oxide, or the like, by any suitable method, such as CVD, PVD, or the like. In an embodiment, the second passivation layer 108 comprises a silicon nitride layer having a thickness of about 4,000 Å.

One of ordinary skill in the art will appreciate that a single layer of conductive/bond pads and a passivation layer are shown for illustrative purposes only. As such, other embodiments may include any number of conductive layers and/or passivation layers. Furthermore, it should be appreciated that one or more of the conductive layers may act as a redistribution layer (RDL) to provide the desired pin or ball layout. For example, FIG. 1 illustrates that the bond pad 106 on the right-hand side of FIG. 1 includes a redistribution line, wherein the opening in the second passivation layer 108 is not aligned directly over the conductive pad 102.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments.

Figure 2:
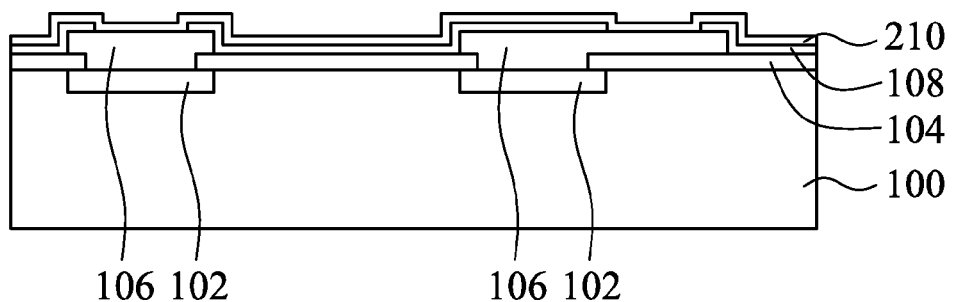

Referring now to FIG. 2, a conformal seed layer 210 is deposited over the surface of the second passivation layer 108 and exposed portions of the bond pads 106. The seed layer 210 is a thin layer of a conductive material that aids in the formation of a thicker layer during subsequent processing steps. In an embodiment, the seed layer 210 may be formed by depositing a thin conductive layer, such as a thin layer of Cu, Ti, Ta, TiN, TaN, and/or the like, using CVD or PVD techniques. For example, in an embodiment, the seed layer 210 comprises a layer of Ti is deposited by a PVD process to a thickness of about 500 Å and a layer of Cu deposited by a PVD process to a thickness of about 3,000 Å.

Figure 3:
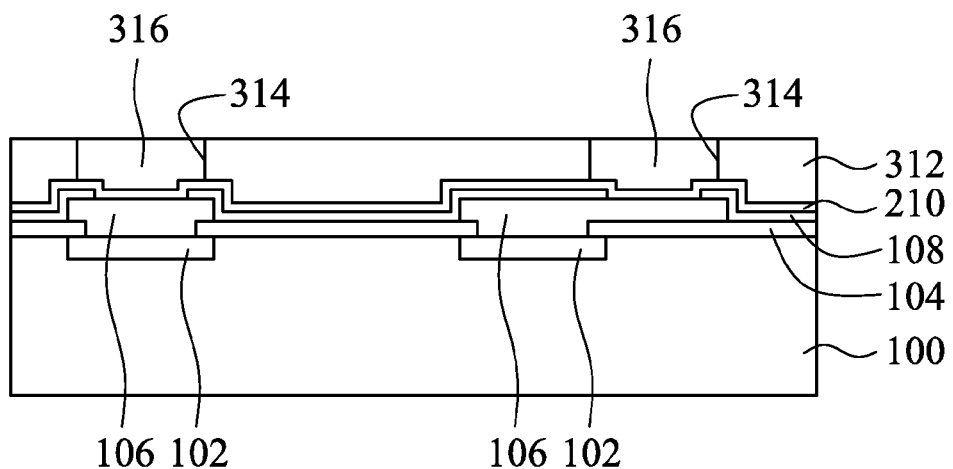

FIG. 3 illustrates a first patterned mask 312 formed over the seed layer 210 and patterned to form openings 314 in accordance with an embodiment. The first patterned mask 312 will act as a mold for forming conductive pads in subsequent processing steps. The first patterned mask 312 may be a patterned photoresist mask, hard mask, or the like.

Thereafter, conductive pillars 316 are formed in the openings 314 of the first patterned mask 312 as illustrated in FIG. 3. The conductive pillar 316 is a conductive material, such as copper, tungsten, or other conductive metal, and may be formed, for example, by electroplating, electroless plating, or the like.

Figure 4:
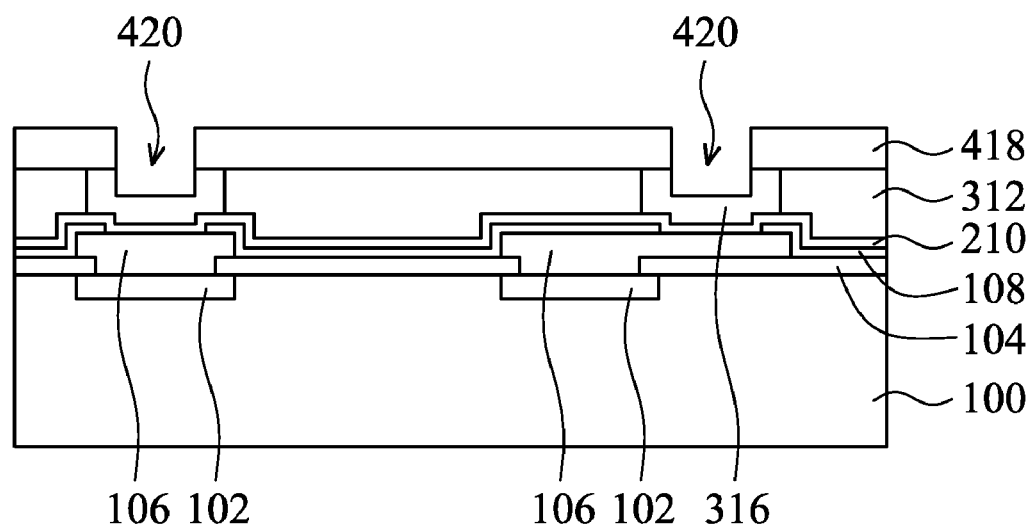

FIG. 4 illustrates a second patterned mask 418 formed over the first patterned mask 312 and the conductive pillars 316 in accordance with an embodiment. The second patterned mask 418 acts as an etch mask for creating a recess 420 in the conductive pillars 316, thereby forming recessed conductive pillars 316. In an embodiment, the recess 420 has substantially vertical sidewalls such as those obtainable through an etch process. As will be explained in greater detail below, the recess 420 will be filled with a solder material in subsequent processing steps. The recess 420 may be formed using, for example, a wet dip in a chemical solution of phosphoric acid ($H_3PO_4$) and hydrogen peroxide ($H_2O_2$). In an embodiment, the recess has a depth from about 20,000 Å to about 80,000 Å, such as about 30,000 Å.

Figure 5:
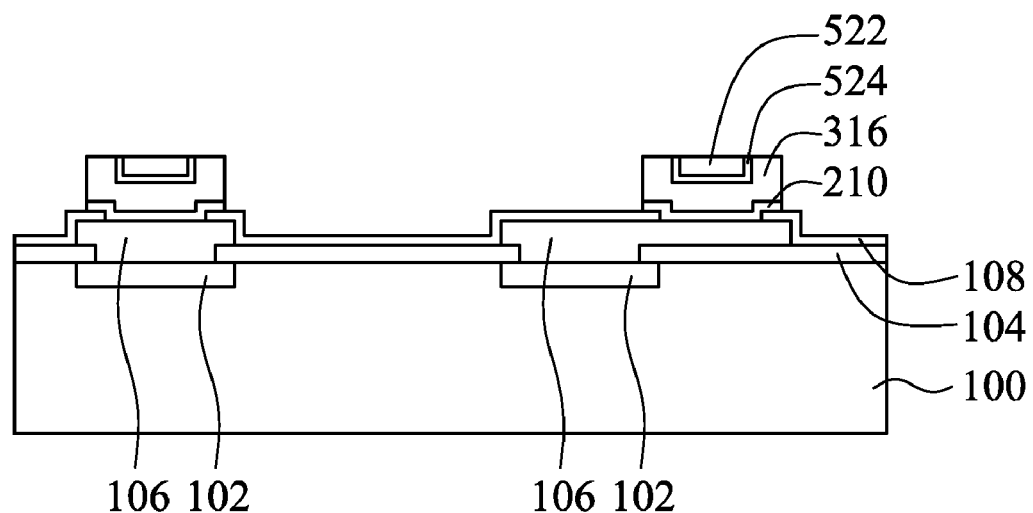

Thereafter, as illustrated in FIG. 5, the recess 420 is filled with a conductive material 522 in accordance with an embodiment. The conductive material 522 may be, for example, SnPb, SnAg, SnAgCu, a high-Pb material, a Sn-based solder, a lead-free solder, or other suitable conductive material. FIG. 5 also shows the formation of an inter-metallic compound (IMC) layer 524. During the soldering process, the IMC layer 524 is naturally formed at the joint between the solder material and the underlying surface. In some embodiments, it may be desirable to position an optional cap layer (not shown) between the recessed conductive pillar 316 and the conductive material 522. It has been found that some materials may create a stronger, more durable IMC layer than others. As such, it may be desirable to form a cap layer to provide an IMC layer having more desirable characteristics. For example, in an embodiment in which the recessed conductive pillar 316 is formed of copper, it may be desirable to utilize a conductive cap layer formed of nickel. Other materials, such as Pt, Au, Ag, combinations thereof, or the like, may also be used. The conductive cap layer may be formed through any number of suitable techniques, including PVD, CVD, ECD, MBE, ALD, electroplating, and the like.

FIG. 5 also illustrates the removal of the first patterned mask 312 and the second patterned mask 418 in accordance with an embodiment. In an embodiment in which the first patterned mask 312 and the second patterned mask 418 are photoresist masks, an $O_2$ plasma ashing process, or wet strip process may be used to remove the first patterned mask 312. The exposed portions of the seed layer 210 may be removed by, for example, a wet etching process such as a wet dip in a chemical solution of phosphoric acid ($H_3PO_4$) and hydrogen peroxide ($H_2O_2$), referred to as DPP, with 2% hydrofluoric (HF) acid, or another cleaning process, may be used. Optionally, a wet dip in a sulfuric acid ($H_2SO_4$) solution may be used to clean the wafer remove remaining photoresist material. A reflow process may be performed, which may cause the solder material 620 to have a rounded shape.

Optionally, a finish layer (not shown) may be applied over the conductive pillar. In an embodiment, the finish layer includes nickel layer directly on, and contacting, the conductive pillar 316. Optionally, additional layers may be formed, such that the finish layer may be an electroless nickel immersion gold (ENIG), a nickel electroless palladium immersion gold (ENEPIG), or a nickel palladium layer. The formation methods of finish layer include ECP, electroless plating, and the like.

Figure 6A:
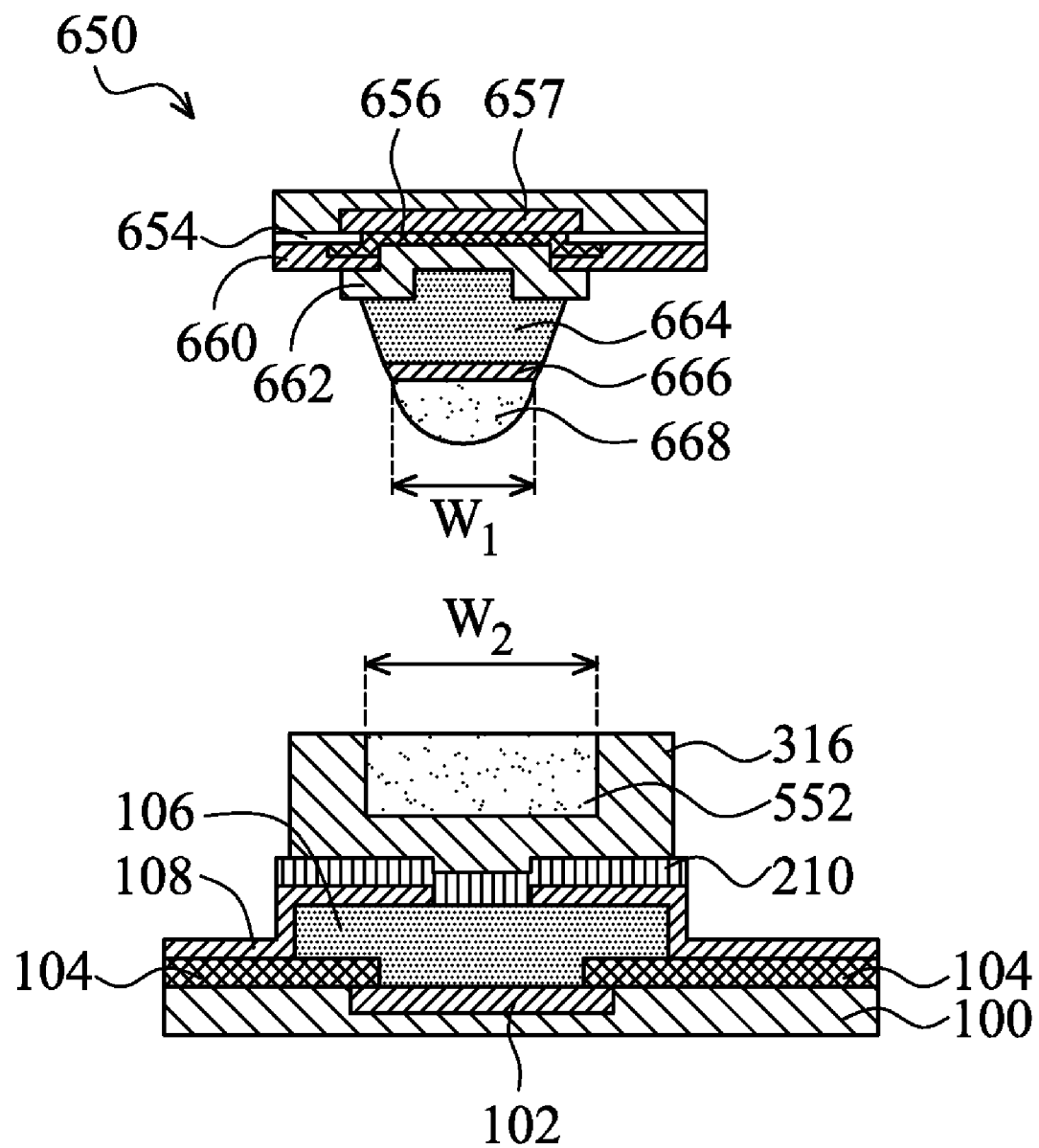
FIGS. 6a, 6b, and 6c illustrate attaching two substrates in accordance with embodiments.
Figure 6B:
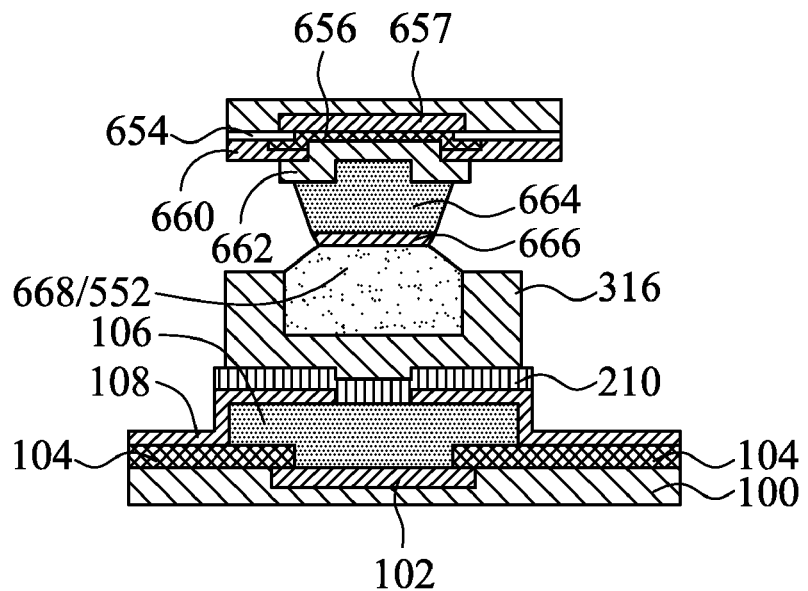
Figure 6C:
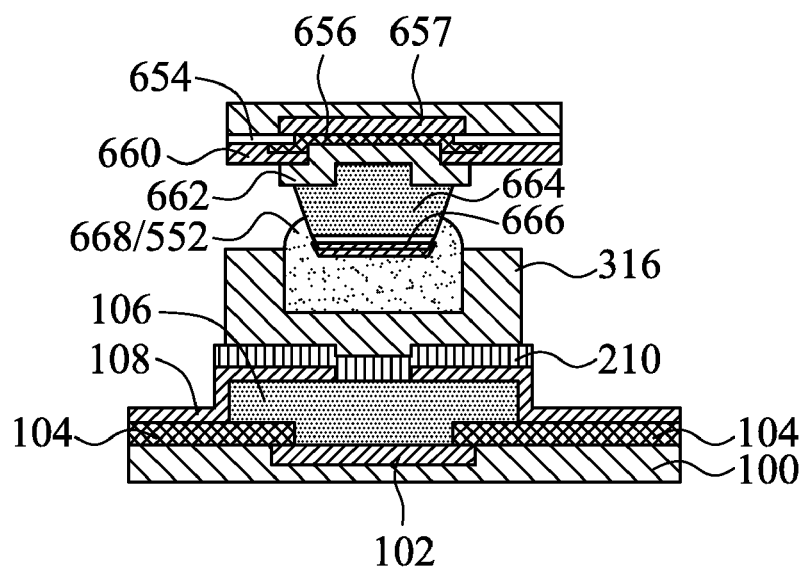

FIGS. 6a-6c illustrate joining two substrates in accordance with an embodiment. The first substrate 600 represents a substrate such as the substrate 100 discussed above with reference to FIGS. 1-4, wherein like reference numerals refer to like elements. The second substrate 650 represents a substrate to be attached to the first substrate 600 and may be an integrated circuit die, an interposer, a packaging substrate, a high-density interconnect, a printed circuit board, or the like.

For purposes of illustration, the second substrate 650 illustrates an example of an interconnect structure that may be used for attaching to the first substrate 600. It should be noted, however, that other types of interconnect structures may be utilized to join the first substrate 600 to the second substrate 650. In this example, the second substrate 650 comprises an electrical contact 657 and a first passivation layer 654 formed of one or more dielectric layers, such as polyimide, polymer, an oxide, a nitride, or the like. In an embodiment, the first passivation layer 654 comprises a composite layer of a layer of silicon nitride having a thickness of about 750 Å with an overlying oxide layer having a thickness of about 8,500 Å. The silicon nitride layer may be formed using CVD techniques using silane and ammonia as precursor gases, the oxide layer may be formed by any oxidation process, such as wet or dry thermal oxidation in an ambient comprising an oxide, $H_2O$, NO, or a combination thereof, or by CVD techniques using is tetra-ethyl-ortho-silicate (TEOS) and oxygen as a precursor. An opening in the first passivation layer 654 exposes a portion of the underlying electrical contact 657.

A conductive pad 656 is formed over the first passivation layer 654 and in contact with the underlying electrical contact 657. The conductive pad 656 may be formed of any suitable conductive material, such as copper, tungsten, aluminum, silver, combinations thereof, or the like. It should be noted that the conductive pad 656 and/or the electrical contact 657 may be a portion of redistribution layer or a through-substrate via. In an embodiment, the conductive pad 856 may aluminum formed by CVD, PVD, electroplating or the like to a thickness of about 12,000 Å.

One or more second passivation layers, such as a second passivation layer 660, are formed and patterned over the conductive pad 656. The second passivation layer 660 may be formed of a dielectric material, such as polymer, an oxide, a nitride, or the like, by any suitable method, such as CVD, PVD, or the like. In an embodiment, the second passivation layer 108 is a composite layer comprising a plasma-enhanced silicon oxynitride (PESION) layer having a thickness of about 300 Å, an undoped silicate glass (USG) layer having a thickness of about 4,000 Å, and a plasma-enhanced silicon nitride (PESIN) layer having a thickness of about 6,000 Å.

Thereafter, a seed layer 662, a conductive pillar 664, a cap layer 666, and a solder layer 668 are formed on the conductive pad 656. The seed layer 662, the conductive pillar 664, the cap layer 666, and the solder layer 668 may be formed of similar materials using similar techniques as those discussed above with reference to the seed layer 210, the recessed conductive pillar 316, and the solder layer 522, respectively.

As shown in FIGS. 6b and 6c, the first substrate 600 and the second substrate 650 are joined such that the conductive pillar 664/cap layer 666 is positioned over the recess of the recessed conductive pillar 316. A width $W_1$ of a contact surface of the conductive pillar 664/cap layer 666 is less than or equal to a width $W_2$ of the recess of the recessed conductive pillar 316. In an embodiment, the width $W_1$ of the contact surface of the conductive pillar 664/cap layer 666 is between about 0.1 and about 1.0 of the width $W_2$ of the recess.

FIG. 6b illustrates the situation wherein the conductive pillar 664/cap layer 666 of the second substrate 650 is not inserted into the recess of the recessed conductive pillar 316, but rather is positioned above the recessed conductive pillar 316. In an embodiment, the conductive pillar 664/cap layer 666 of the second substrate 650 is positioned from 5,000 Å to about 50,000 Å above the recessed conductive pillar 316. FIG. 6c illustrates an embodiment in which the conductive pillar 664/cap layer 666 of the second substrate 650 is inserted into or even with the recess of the recessed conductive pillar 316. It should be noted that the conductive pillar 664/cap layer 666 is illustrated as having a trapezoidal shape for illustrative purposes only. Other embodiments may utilize other shapes, such as a rectangular shape. The conductive pillar 664/cap layer 666 may be inserted into the recess of the recessed conductive pillar 316 between 0 Å to about 50,000 Å.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a device, the method comprising:
providing a first substrate having a conductive pad formed thereon;
forming a conductive pillar on the first substrate, the conductive pillar being in electrical contact with the conductive pad; and
forming, after the forming the conductive pillar, a recess in a top surface of the conductive pillar, thereby forming a recessed conductive pillar, the conductive pillar being a non-solder material.

2. The method of claim 1, further comprising forming a solder material in the recess.

3. The method of claim 2, wherein the solder material comprises SnPb, SnAg, SnAgCu, a high-Pb material, a Sn-based solder, a lead-free solder, or a combination thereof.

4. The method of claim 1, wherein the recess has a depth of about 3 μm.

5. The method of claim 1, further comprising providing a second substrate, the second substrate having a second conductive pillar, the second substrate being attached to the first substrate such that the second conductive pillar is positioned above the recess in the recessed conductive pillar on the first substrate.

6. The method of claim 5, wherein the second conductive pillar is inserted into the recess.

7. The method of claim 5, wherein the second conductive pillar is positioned above the recessed conductive pillar.

8. The method of claim 5, wherein the second conductive pillar has a trapezoidal shape.

9. The method of claim 5, wherein at least one of the first substrate and the second substrate is an integrated circuit die and the other substrate is an interposer, packaging substrate, high-density interconnect, or printed circuit board.

10. The method of claim 5, wherein the first substrate is a first integrated circuit die and the second substrate is a second integrated circuit die.

11. A method of forming a device, the method comprising:
providing a first substrate having a conductive pillar formed thereon, the conductive pillar being an external contact; and
removing a portion of the conductive pillar, thereby forming a recess in the conductive pillar.

12. The method of claim 11, wherein the removing comprises etching an upper surface of the conductive pillar.

13. The method of claim 11, wherein the removing comprises:
forming a patterned mask such that a portion of an upper surface of the conductive pillar is exposed;
etching the recess in the conductive pillar; and
removing the patterned mask.

14. The method of claim 11, further comprising forming a solder material in the recess.

15. A method of forming a device, the method comprising:
providing a first substrate having a conductive pillar formed thereon, the conductive pillar being an external contact;
forming a mask over the conductive pillar, the mask exposing at least a portion of the conductive pillar;
removing at least a portion of exposed regions of the conductive pillar, recessing an upper surface of the conductive pillar to form a recess.

16. The method of claim 15, wherein the recess has an upper surface lower than a periphery of the conductive pillar.

17. The method of claim 15, further comprising removing the mask.

18. The method of claim 15, wherein the removing is performed at least in part by etching.

19. The method of claim 15, further comprising forming a solder material in the recess.

20. The method of claim 19, wherein the solder material comprises SnPb, SnAg, SnAgCu, a high-Pb material, a Sn-based solder, a lead-free solder, or a combination thereof.

* * * * *